(12) United States Patent
Kuo

(10) Patent No.: US 12,342,663 B2
(45) Date of Patent: Jun. 24, 2025

(54) SEMICONDUCTOR CHIP WITH PROTRUDING PORTION AND LIGHT-EMITTING DEVICE HAVING THE SAME

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 927 days.

(21) Appl. No.: 17/384,812

(22) Filed: Jul. 26, 2021

(65) Prior Publication Data

US 2022/0302349 A1    Sep. 22, 2022

(30) Foreign Application Priority Data

Mar. 18, 2021    (CN) .................. 202110289497.3

(51) Int. Cl.
  *H10H 20/831*    (2025.01)
  *H10H 20/85*    (2025.01)
  *H10H 20/857*    (2025.01)

(52) U.S. Cl.
  CPC .... *H10H 20/8312* (2025.01); *H10H 20/8506* (2025.01); *H10H 20/857* (2025.01)

(58) Field of Classification Search
  CPC ........... H10H 20/8312; H10H 20/8506; H10H 20/857; H10H 20/84; H10H 20/819; H10H 20/018; H10H 20/82; H10H 20/825; H10H 20/831; H10H 20/833; H10H 20/8513; H01L 25/0753; H01L 25/167; H01L 33/382; H01L 33/486; H01L 33/62; H01L 33/22; H01L 33/32; H01L 33/42;

(Continued)

(56) References Cited

U.S. PATENT DOCUMENTS

| 8,877,648 B2 | 11/2014 | Bower et al. |
| 9,217,541 B2 | 12/2015 | Bathurst et al. |
| 9,401,344 B2 | 7/2016 | Bower et al. |

(Continued)

FOREIGN PATENT DOCUMENTS

| CN | 109920813 A | 6/2019 |
| CN | 110676355 A | 1/2020 |

(Continued)

*Primary Examiner* — Jami Valentine Miller
*Assistant Examiner* — Pratiksha Jayant Lohakare
(74) *Attorney, Agent, or Firm* — CKC & Partners Co., LLC

(57) ABSTRACT

A semiconductor chip comprises a semiconductor stack and a passivation layer. The semiconductor stack comprises a top surface, a bottom surface opposite to the top surface, and a plurality of sidewalls between the top surface and the bottom surface. The passivation layer conformally covers the top surface and the sidewalls of the semiconductor stack. When viewing from the bottom surface, a plan-view contour of the semiconductor stack comprises a plurality of edges and corners. Each of the corners is defined by two adjacent edges. A plan-view contour of the passivation layer surrounding the plan-view contour of the semiconductor stack comprises a protruding portion adjacent to one of the corners and the protruding portion protrudes outwards from the plan-view contour of the passivation layer.

16 Claims, 17 Drawing Sheets

(58) Field of Classification Search
CPC ....... H01L 33/504; H01L 33/20; H01L 33/44; H01L 33/0093; H01L 33/38
USPC .......................................................... 257/79
See application file for complete search history.

(56) References Cited

U.S. PATENT DOCUMENTS

| | | |
|---|---|---|
| 9,929,053 B2 | 3/2018 | Bower et al. |
| 10,224,231 B2 | 3/2019 | Bower et al. |
| 10,832,935 B2 | 11/2020 | Bower et al. |
| 2014/0159043 A1 | 6/2014 | Sakariya et al. |
| 2015/0145902 A1* | 5/2015 | Nakayama ........... G09G 3/3233 345/691 |
| 2017/0331020 A1* | 11/2017 | Oh ....................... H10H 29/142 |
| 2018/0047780 A1* | 2/2018 | Yeon ...................... H10H 20/84 |
| 2019/0051552 A1 | 2/2019 | Bower et al. |
| 2019/0165207 A1* | 5/2019 | Kim ..................... H01L 33/385 |
| 2019/0181181 A1* | 6/2019 | Yeon ..................... H01L 27/156 |
| 2019/0326351 A1 | 10/2019 | Aledia |
| 2020/0219858 A1* | 7/2020 | Chang ................. H01L 25/0753 |
| 2020/0243723 A1* | 7/2020 | Kim ..................... H10H 20/813 |
| 2020/0295081 A1* | 9/2020 | Lee ..................... H10H 29/142 |
| 2021/0126043 A1* | 4/2021 | Lee ................... H10H 20/8316 |

FOREIGN PATENT DOCUMENTS

| | | |
|---|---|---|
| TW | 201730095 A | 9/2017 |
| TW | I690079 B | 4/2020 |
| TW | I708405 B | 10/2020 |

\* cited by examiner

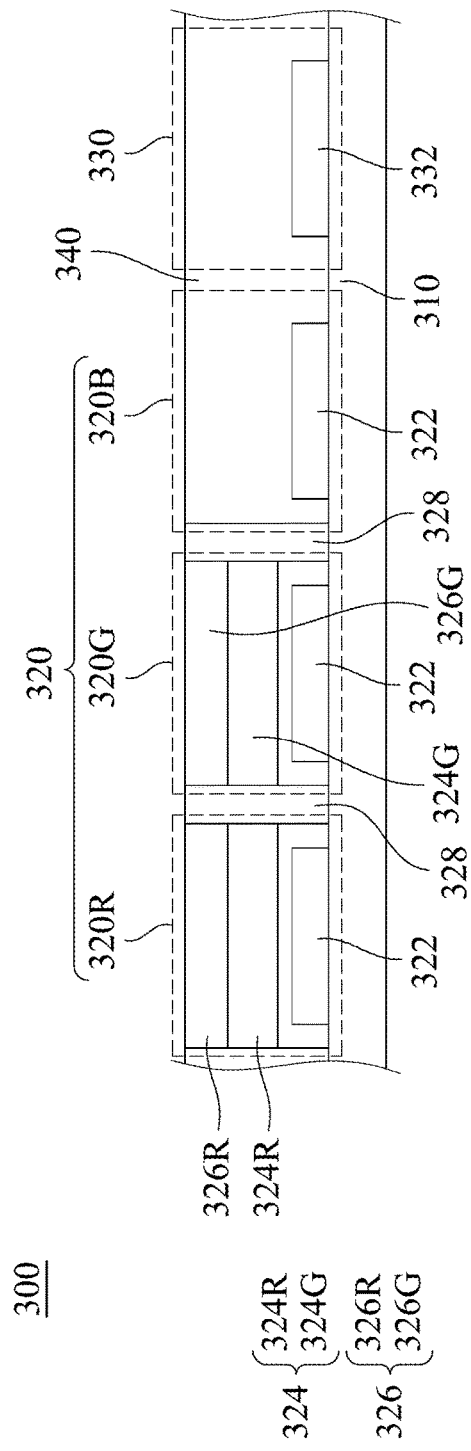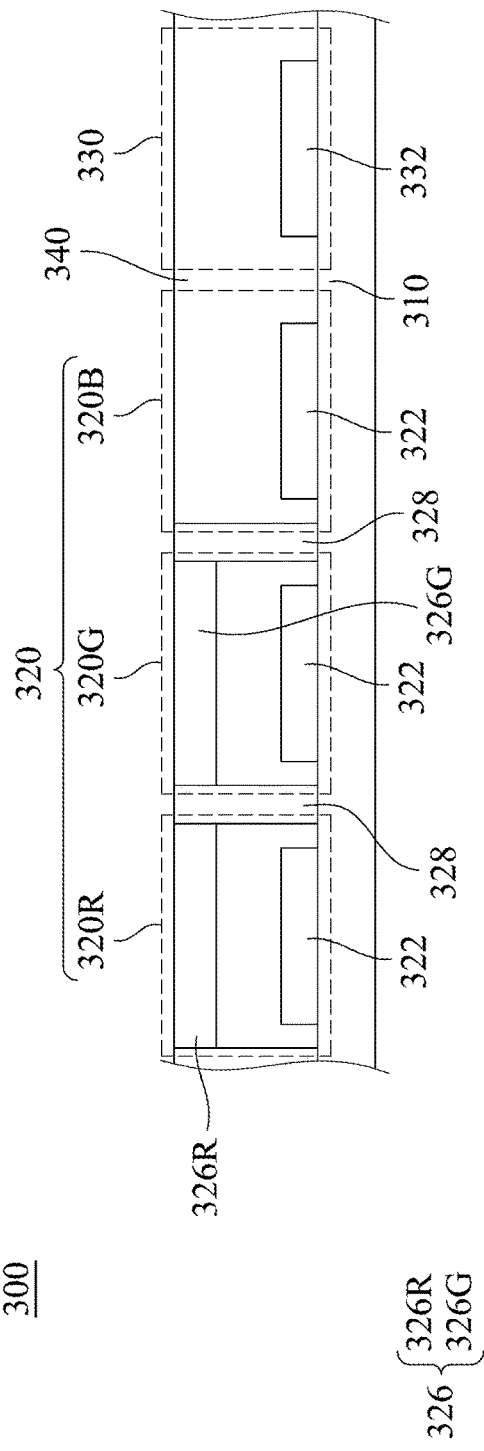

SEMICONDUCTOR CHIP WITH PROTRUDING PORTION AND LIGHT-EMITTING DEVICE HAVING THE SAME

CROSS-REFERENCE TO RELATED APPLICATION

This application claims priority to China Application Serial Number 202110289497.3, filed Mar. 18, 2021, which is herein incorporated by reference in its entirety.

BACKGROUND

Field of Invention

The present disclosure relates to a semiconductor chip and a light-emitting device.

Description of Related Art

In recent years, various novel displays have gradually become popular. These displays are mainly developed towards a direction of increasing resolution and saving energy. A micro light-emitting diode (μLED) is one of the important types of displays in development.

Micro light-emitting diodes have reduced the size of conventional light-emitting diodes to below about 100 micron, or even to a magnitude of tens of micron. The number of the LEDs in the same area significantly increases at this magnitude, so the yield of the LEDs transferred from a substrate to a display substrate should reach above 99%. With techniques of recent processes, this mass transfer still faces several problems to be solved.

SUMMARY

An aspect of the disclosure is to provide a light conversion material which can effectively solve the aforementioned problems.

According to some embodiments of the present disclosure, a semiconductor chip comprises a semiconductor stack and a passivation layer. The semiconductor stack comprises a top surface, a bottom surface opposite to the top surface, and a plurality of sidewalls between the top surface and the bottom surface. The passivation layer conformally covers the top surface and the sidewalls of the semiconductor stack. When viewing from the bottom surface, a plan-view contour of the semiconductor stack comprises a plurality of edges and corners. Each of the corners is defined by two adjacent edges. A plan-view contour of the passivation layer surrounding the plan-view contour of the semiconductor stack comprises a protruding portion adjacent to one of the corners and the protruding portion protrudes outwards from the plan-view contour of the passivation layer.

According to some embodiments of the present disclosure, the protruding portion of the passivation layer has a fracture surface.

According to some embodiments of the present disclosure, the bottom surface has a concave-and-convex structure.

According to some embodiments of the present disclosure, the semiconductor chip is a light-emitting diode chip and the semiconductor chip further comprises a first electrode on the passivation layer. The semiconductor stack comprises a first semiconductor layer, an active layer and a second semiconductor layer stacked in order and the first electrode penetrates the passivation layer to electrically connect to the first semiconductor layer.

According to some embodiments of the present disclosure, the semiconductor chip further comprises a second electrode on the passivation layer and the second electrode penetrating the passivation layer to electrically connect to the second semiconductor layer. The first electrode and the second electrode are on a same side of the semiconductor stack.

According to some embodiments of the present disclosure, the semiconductor chip further comprises a second electrode on the bottom surface of the semiconductor stack and the second electrode electrically connects to the second semiconductor layer. The first electrode and the second electrode are respectively on opposite sides of the semiconductor stack.

According to some embodiments of the present disclosure, wherein the semiconductor chip is an integrated circuit chip and the semiconductor chip further comprises a first electrode on the semiconductor stack to electrically connect to the semiconductor stack.

According to some embodiments of the present disclosure, a light-emitting device comprises a substrate, a plurality of light-emitting units and a control unit. The light-emitting units are on the substrate. The light-emitting units emit red light, green light or blue light respectively, and an opaque structure is between two adjacent light-emitting units. At least one of the light-emitting units comprises a semiconductor chip. The control unit is on the substrate, and the control unit electrically connects to at least one of the light-emitting units.

According to some embodiments of the present disclosure, a semiconductor chip comprises a semiconductor stack and a passivation layer. The semiconductor stack comprises a top surface, a bottom surface opposite to the top surface and a plurality of sidewalls between the top surface and the bottom surface. The passivation layer conformally covers the top surface and the sidewalls of the semiconductor stack. When viewing from the bottom surface, a plan-view contour of the semiconductor chip is a closed shape with a plurality of edges and corners. Each of the corners is defined by two adjacent edges and at least one of the corners has a fracture surface.

According to some embodiments of the present disclosure, in a range of the plan-view contour of the semiconductor chip, a connecting line of any two non-adjacent ones of the corners is not in equal length.

According to some embodiments of the present disclosure, the semiconductor chip is a light-emitting diode chip and the semiconductor chip further comprises a first electrode on the passivation layer. The semiconductor stack comprises a first semiconductor layer, an active layer and a second semiconductor layer stacked in order and the first electrode penetrates the passivation layer to electrically connect to the first semiconductor layer.

According to some embodiments of the present disclosure, the semiconductor chip further comprises a second electrode on the passivation layer, and the second electrode penetrates the passivation layer to electrically connect to the second semiconductor layer. The first electrode and the second electrode are on a same side of the semiconductor stack.

According to some embodiments of the present disclosure, the semiconductor chip further comprises a second electrode on the bottom surface of the semiconductor stack and the second electrode electrically connects to the second semiconductor layer. The first electrode and the second electrode are respectively on opposite sides of the semiconductor stack.

According to some embodiments of the present disclosure, the semiconductor chip is an integrated circuit chip and the semiconductor chip further comprises a first electrode on the semiconductor stack to electrically connect to the semiconductor stack.

According to some embodiments of the present disclosure, a light-emitting device comprises a substrate, a plurality of light-emitting units and a control unit. The light-emitting units are on the substrate. The light-emitting units emit red light, green light or blue light respectively and an opaque structure is between two adjacent light-emitting units. At least one of the light-emitting units comprises a semiconductor chip. The control unit is on the substrate and the control unit electrically connects to at least one of the light-emitting units.

According to some embodiments of the present disclosure, the plan-view contour of the semiconductor chip is a closed quadrilateral comprising four edges and four corners.

According to some embodiments of the present disclosure, a light-emitting device comprises a substrate and a plurality of light-emitting diode chips. The light-emitting diode chips are arranged at least in a first direction on the substrate. At least one of the light-emitting diode chips comprises a semiconductor stack and a passivation layer. The semiconductor stack comprises a top surface, a bottom surface opposite to the top surface and at least a sidewall between the top surface and the bottom surface. The semiconductor stack comprises a first semiconductor layer, an active layer and a second semiconductor layer stacked in order. The passivation layer conformally covers the top surface and the sidewall of the semiconductor stack. The passivation layer comprises a protruding portion, and an extension direction of the protruding portion and the first direction together define a first angle. The first angle is an acute angle.

According to some embodiments of the present disclosure, the protruding portion of the passivation layer has a fracture surface.

According to some embodiments of the present disclosure, each of the light-emitting diode chips further comprises a first electrode and a second electrode, and the first electrode and the second electrode are respectively on opposite sides of the semiconductor stack.

According to some embodiments of the present disclosure, the light-emitting device further comprises an integrated circuit (IC) chip on the substrate and the IC chip electrically connects to at least one of the light-emitting diode chips.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 13A-13B illustrate cross-section views of a light-emitting device including light-emitting units and a control unit in accordance with some embodiments of the present disclosure.

DETAILED DESCRIPTION

Figure 1:
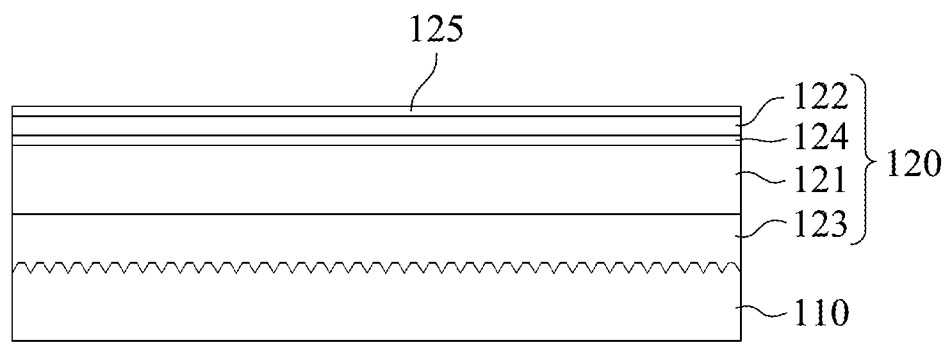
FIGS. 1-9 illustrate cross-section views of a semiconductor chip in the intermediate manufacturing process in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present disclosure can increase the number of chips produced per wafer. Specifically, the location of tether structures of the chips may be changed that tether structures of the chips are placed at the corners of the chips. This may decrease the distance between the chips, so that more chips are produced per wafer. Further, this also may reduce the area of tether structures remaining on the transferred chips and improve the lighting efficiency of the chips.

FIGS. 1-9 illustrate cross-section views of a semiconductor chip in the intermediate manufacturing process in accordance with some embodiments of the present disclosure. In FIG. 1, a first substrate 110 is provided. The first substrate 110 may be any suitable materials. In some embodiments, the first substrate 110 is a sapphire substrate. Then a semiconductor stack 120 may be deposited on the first substrate 110. The semiconductor stack 120 may include n-type/p-type semiconductor layers made of different materials, or the same material doped with n-type/p-type impurities, for example, a first semiconductor layer 121, a second semiconductor layer 122 and an optionally formed third semiconductor layer 123 as shown in FIG. 1. In some embodiments, the semiconductor stack 120 may also include an active layer 124 between the first semiconductor layer 121 and the second semiconductor layer 122. In some embodiments, a transparent conductive layer 125 may be deposited on the semiconductor stack 120.

In some embodiments, the first semiconductor layer 121 is a n-type doped GaN and the second semiconductor layer 122 is a p-type doped GaN, or vice versa. In addition, the third semiconductor layer 123 may be an undoped GaN as a buffer layer between the first semiconductor layer 121 and the first substrate 110. The active layer 124 may be GaN added with quantum well structures and/or quantum dot structures, therefore when current flowing through the active layer 124, the active layer 124 may emit light with specific wavelength. The transparent conductive layer 125 may be made of indium tin oxide (ITO) or other suitable materials.

Figure 2:
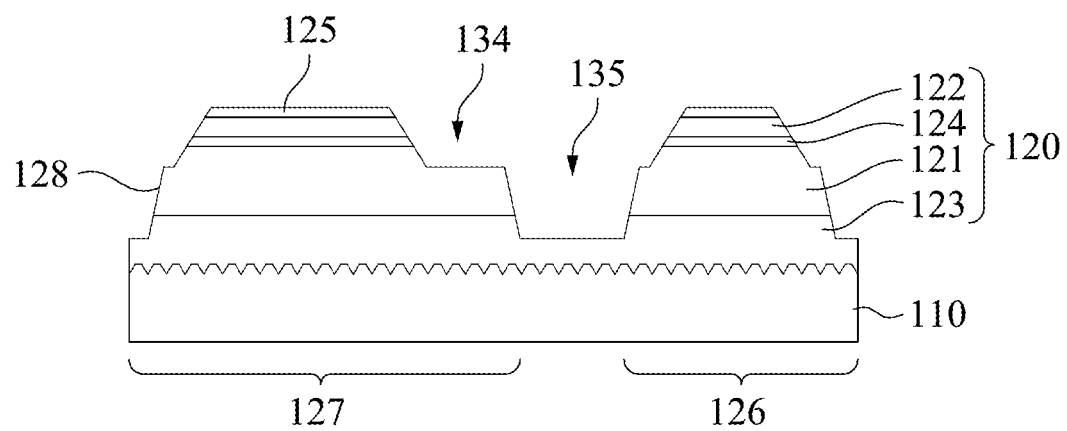

As shown in FIG. 2, trenches 134 and 135 are formed in the transparent conductive layer 125 and the semiconductor stack 120. In some embodiments, an etching process, such as a dry etching process, may be used to form the trenches 134 and 135. For example, a first etching process is performed in the transparent conductive layer 125 and the semiconductor stack 120 to form a shallow and wide trench 134. A second etching process is then performed to form a deep and narrow trench 135 in the first semiconductor layer 121 and the semiconductor layer 123. In this etching process, the trenches 134 and 135 partially divide the semiconductor stack 120 into a tether structure 126 and a patterned semiconductor stack 127 (i.e. the bottom of the trenches 134 and 135 is spaced apart from the first substrate 110 by a distance), and the trench 135 defines sidewalls 128 (such as the plan-view contour 129 in FIGS. 11A-11D) of the patterned semiconductor stack 127. The sidewalls 128 may define the shape of the subsequently formed semiconductor chip 100. The location of the tether structure 126 is also determined in this operation and will be discussed in FIGS. 11A-11D in greater detail. In some embodiments, a distance, which is used to form the electrode holes and electrodes in subsequent processes, is between the boundaries of the trenches 134 and 135.

Figure 3:
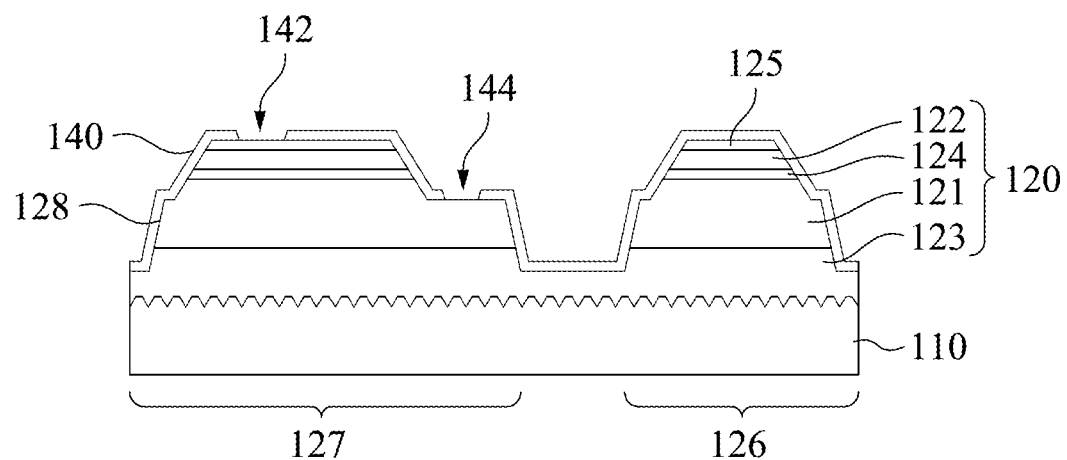

As shown in FIG. 3, a passivation layer 140 is conformally deposited on the transparent conductive layer 125 and the semiconductor stack 120. Thus, the outer contour of the passivation layer 140 (such as the plan-view contour 145 in FIGS. 11A-11D) is only slightly larger than the outer contour of the semiconductor chip 100 (i.e. a range defined by the sidewalls 128). The passivation layer 140 may be used to protect the exposed surfaces of the semiconductor stack 120 to prevent from the penetration of external particles and water vapor in the environment, and ensure that there is no electrical connection between the first semiconductor layer 121, the second semiconductor layer 122 and the subsequently formed conductive layers except through the electrode holes. In some embodiments, the passivation layer 140 may be an insulator layer.

Next, a first electrode hole 142 and a second electrode hole 144 are formed in the passivation layer 140. The first electrode hole 142 and the second electrode hole 144 are used to respectively expose the second semiconductor layer 122 (or the transparent conductive layer 125 which electrically connects to the second semiconductor layer 122) and the first semiconductor layer 121.

Figure 4:
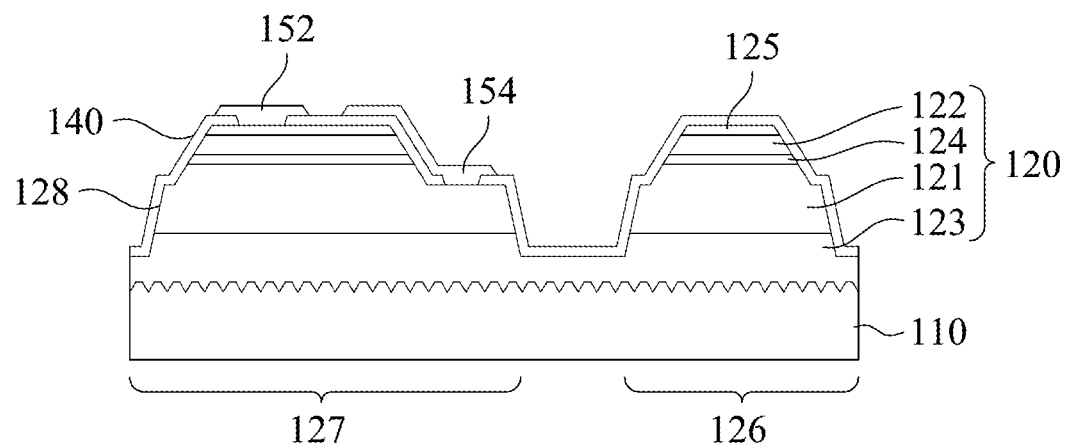

Next, as shown in FIG. 4, a first electrode 152 and a second electrode 154 are respectively formed in the first electrode hole 142 and the second electrode hole 144. The first electrode 152 and the second electrode 154 are both on the same side of the semiconductor stack 120. The first electrode 152 and the second electrode 154 are respectively in contact with the second semiconductor layer 122 (or the transparent conductive layer 125 which electrically connects to the second semiconductor layer 122) and the first semiconductor layer 121 to provide electrical connection between the semiconductor chip 100 and the circuit board of the display device in the subsequent application.

Figure 5:
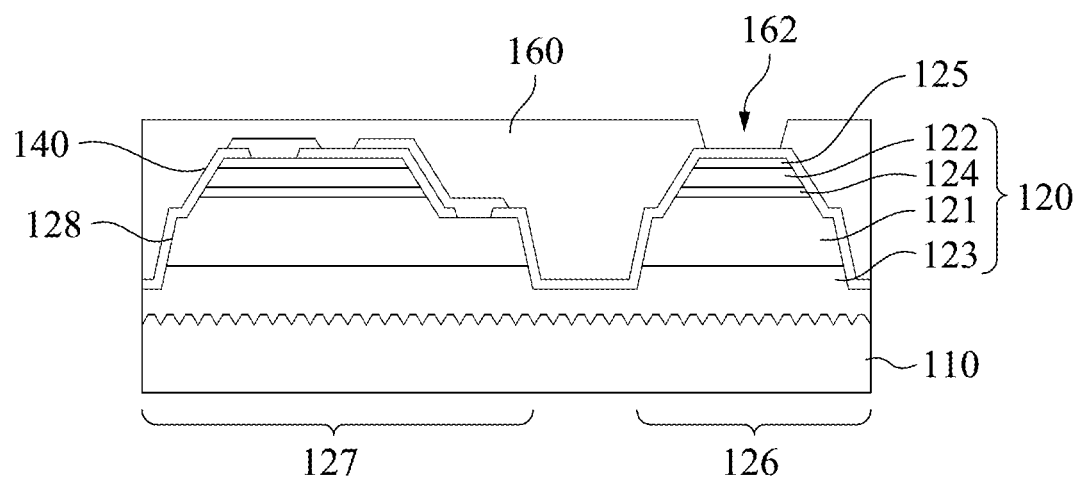

As shown in FIG. 5, a sacrificial layer 160 is formed on the passivation layer 140, the first electrode 152 and the second electrode 154. After forming the sacrificial layer 160, a recess 162 is formed over the tether structure 126 by performing an etching process or other suitable methods. Moreover, the bottom portion of the recess 162 exposes a portion of the passivation layer 140 over the tether structure 126.

Figure 6:
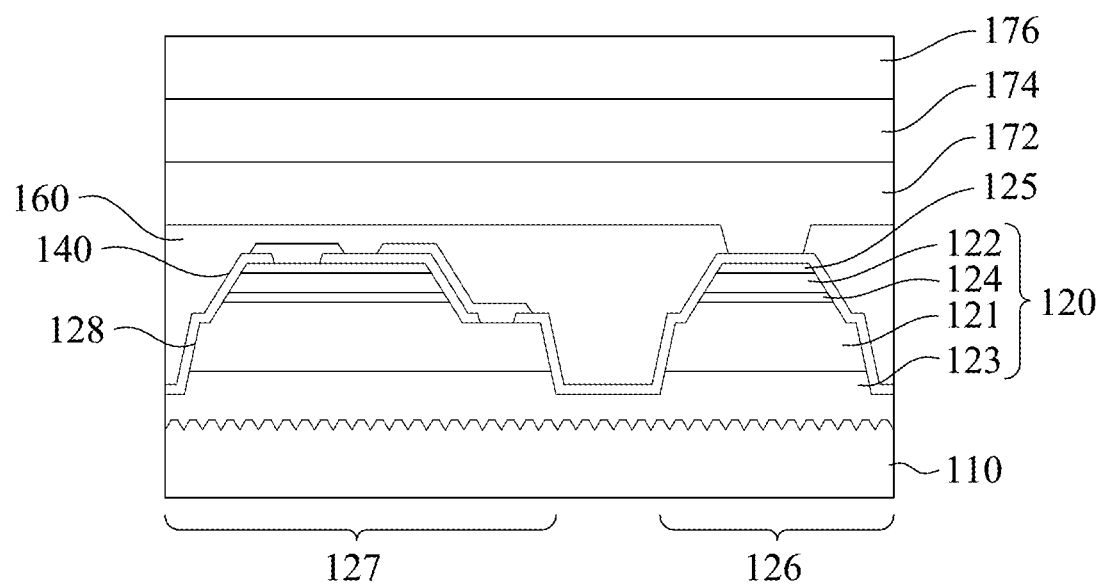

As shown in FIG. 6, a supporting structure layer 172, a bonding layer 174 and a second substrate 176 are sequentially deposited on the sacrificial layer 160, and the supporting structure layer 172 is in contact with the passivation layer 140 over the tether structure 126 through the recess 162 (as shown in FIG. 5). In some embodiments, the supporting structure layer 172 is made of $SiO_2$ and may be used to support the tether structure 126 and the patterned semiconductor stack 127 during the subsequent device-transferring process. The bonding layer 174 is a metal layer interconnecting semiconductor layer and the second substrate 176, and the second substrate 176 may be the substrate similar to the first substrate 110.

Figure 7:
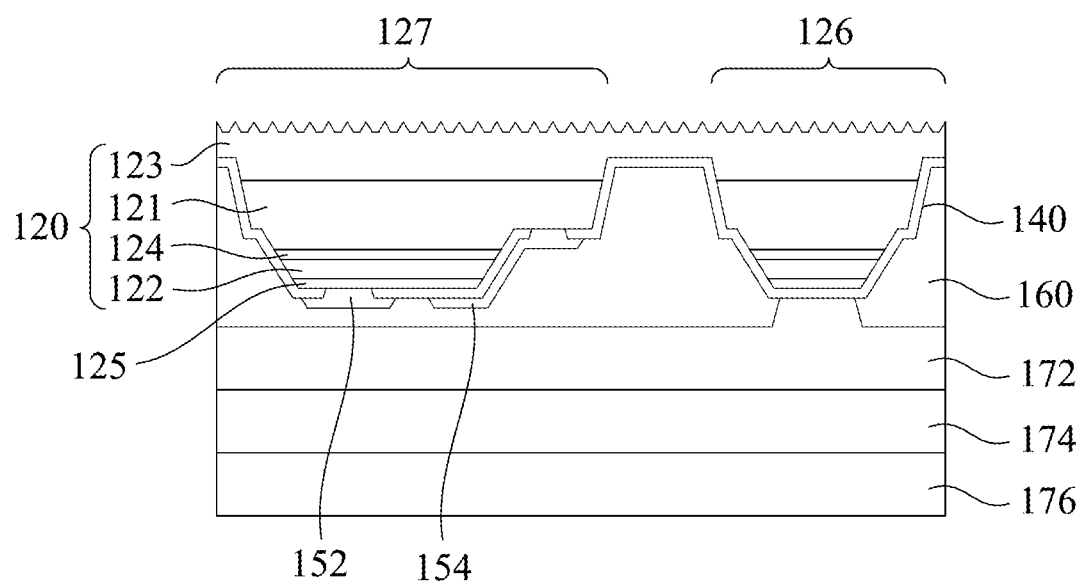

As shown in FIG. 7, the structure as shown in FIG. 6 is flipped, and the first substrate 110 is removed. In some embodiments, an etching process, laser-lift-off process may be used to remove the first substrate 110. In some embodiments, after removing the first substrate 110, the exposed surface of the third semiconductor layer 123 is a rough surface.

Figure 8:
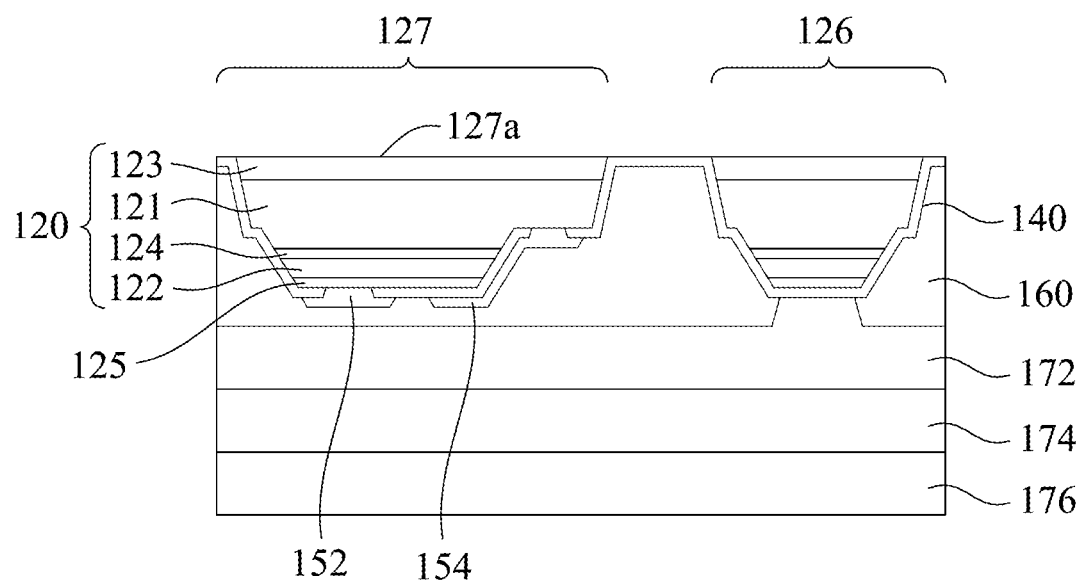
Figure 9:
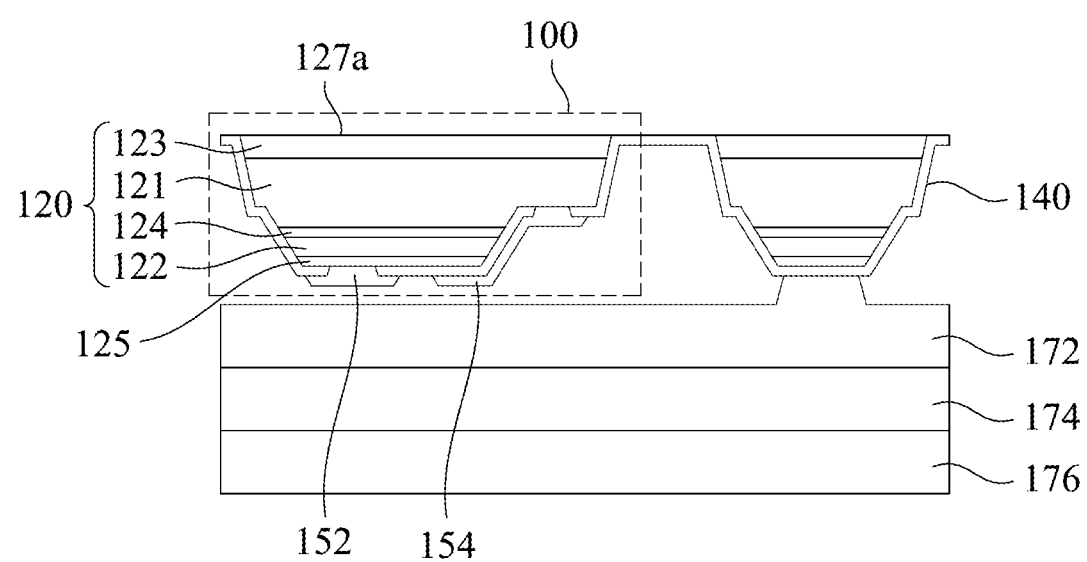

As shown in FIG. 8, a portion of the semiconductor stack 120 is removed until a portion of the surface of the passivation layer 140 between the tether structure 126 and the semiconductor stack 127 is exposed. The bottom surface 127a of the patterned semiconductor stack 127 is also exposed. The bottom surface 127a may remain rough, and may be flat, too. The bottom surface 127a herein refers to the surface farther from the active layer 124 in the semiconductor stack 127. In other words, in this operation, the passivation layer 140 will not be removed. Any suitable methods, such as chemical mechanical polishing, etching process, etc., may be used to remove the portion of the semiconductor stack 120. After removing the portion of the semiconductor stack 120, the manufacturing process of the semiconductor chip 100 (as shown in FIG. 9) is finished. In some embodiments, the semiconductor chip 100 may be used as a light-emitting diode (LED) chip in the subsequent application.

Figure 10A:
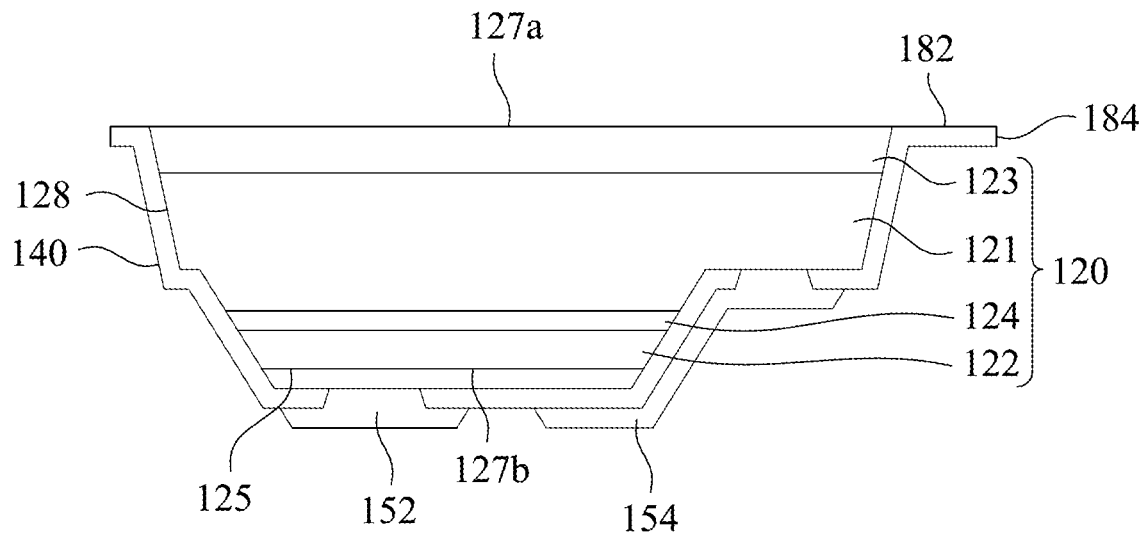
FIGS. 10A-10B illustrate cross-section views of the semiconductor chip in accordance with some embodiments of the present disclosure.

As shown in FIG. 9, the sacrificial layer 160 is removed. Any suitable methods, such as chemical etching, may be used to remove the sacrificial layer 160. Therefore, the sacrificial layer 160 is able to be removed under the situation that the semiconductor chip 100 is not damaged. After removing the sacrificial layer 160, the semiconductor chip 100 is attached to the tether structure 126 by the passivation layer 140. Subsequently, the semiconductor chip 100 is transferred by using transfer techniques. The semiconductor chip 100 (as shown in FIG. 10A) includes the semiconductor stack 127, the passivation layer 140, the first electrode 152 and the second electrode 154. During transferring the semiconductor chip 100, a transfer apparatus (such as stamp) is in contact with the semiconductor chip 100 from the bottom surface 127a, and then the transfer apparatus removes the semiconductor chip 100. Meanwhile, the tether structure 126 is still fixed on the supporting structure layer 172, so the operation of removing separates the semiconductor chip 100 from the tether structure 126. After being separated, the semiconductor chip 100 is transferred to the device in subsequent application, such as a circuit board (such as the substrate 310 in FIG. 13A).

Figure 10B:
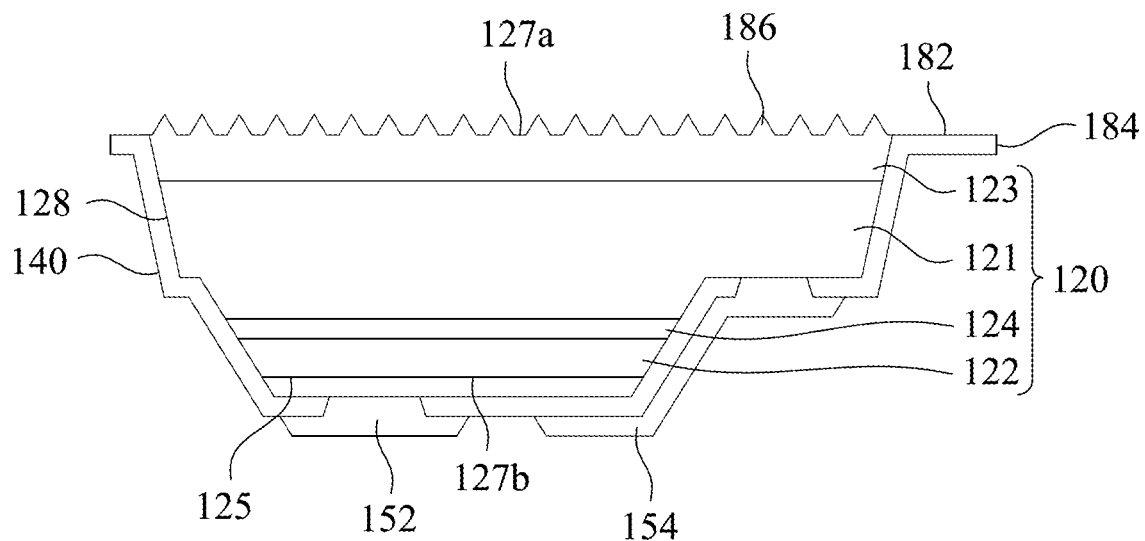

FIG. 10A illustrates a cross-section view of the semiconductor chip 100 in accordance with some embodiments of the present disclosure. The semiconductor stack 127 of the semiconductor chip 100 has a bottom surface 127a and a top surface 127b, and sidewalls 128 are between the bottom surface 127a and the top surface 127b. The top surface 127b is closer to the active layer 124 compared with the bottom surface 127b. Because the semiconductor chip 100 is directly removed from the tether structure 126 by a transfer apparatus, the passivation layer 140 fractures at a connection part between the tether structure 126 and the semiconductor stack 127, forming a protruding portion 182 with a fracture surface 184. The protruding portion 182 and the bottom surface 127a are substantially coplanar. In some other embodiments, a concave-and-convex structure 186 may be formed on the bottom surface 127a, as shown in FIG. 10B. If the bottom surface 127a has the concave-and-convex structure 186, total internal reflection of light may be reduced to improve light extraction.

Figure 11A:
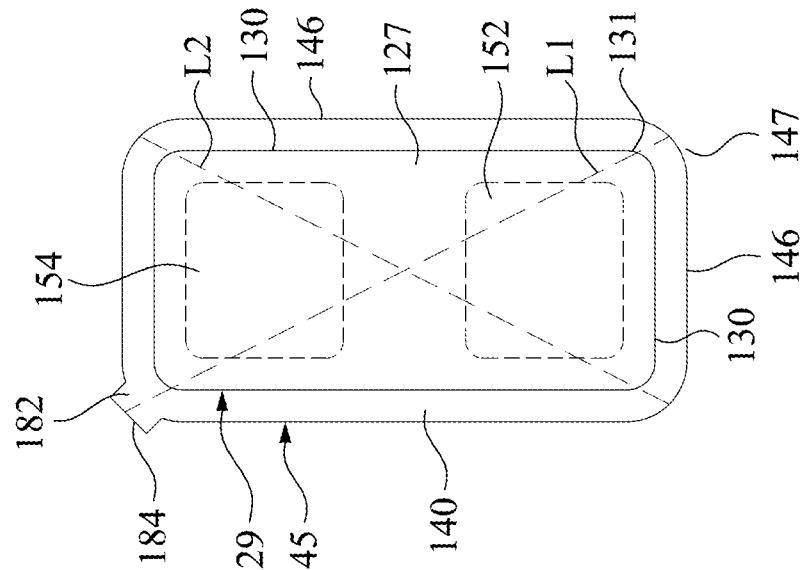
FIGS. 11A-11D illustrate plan views of the semiconductor chip from the bottom surface in accordance with some embodiments of the present disclosure.

FIGS. 11A-11D illustrate plan-views of the semiconductor chip 100 from the bottom surface 127a in accordance with some embodiments of the present disclosure. In FIG. 11A, the semiconductor stack 127 of the semiconductor chip 100 has a plan-view contour 129 with multiple edges 130. The plan-view contour 129 has four edges 130 if the plan-view contour 129 is a quadrilateral. However, in some other embodiments, the plan-view contour 129 may be a triangle or polygon with more than four sides. Two adjacent edges 130 together define a corner 131. In FIGS. 11A-11D, the plan-view contour 129 has four corners 131.

The passivation layer 140 of the semiconductor chip 100 also has a plan-view contour 145. The shape of the plan-view contour 145 may be substantially the same as the shape of the plan-view contour 129. For example, in FIGS. 11A-11D, the plan-view contour 129 is a quadrilateral, and the plan-view contour 145 is also a quadrilateral. The plan-view contour 145 has multiple edges 146. Two adjacent edges 146 together define a corner 147. The corners 131 of the plan-view contour 129 are substantially aligned with the corners 147 of the plan-view contour 145. The protruding portions 182, as discussed above, are adjacent the corners 131 (i.e. at the corners 147), and the protruding portions 182 protrude outwards from the plan-view contour 145 of the passivation layer 140.

As discussed above, during the transfer after the manufacturing process in FIG. 9, the passivation layer 140 fractures at the connection part between the tether structure 126 and the semiconductor chip 100. The fractured passivation layer 140 is the protruding portion 182, so the fracture part of the protruding portion 182 has the fracture surface 184. The fracture surface 184 herein is a section randomly formed due to the fracture and the formation of the fracture surface 184 is related to removal strength and angles. Therefore, each of the protruding portions 182 has the fracture surface 184 with different shapes and each of the protruding portions 182 may also have different extension lengths. For example, in FIG. 11A, two protruding portions 182 across corners may have the fracture surfaces 184 with different shapes and/or with different extension lengths. Similarly, in FIGS. 11C-11D, each of the protruding portions 182 may have the fracture surfaces 184 with different shapes and/or with different extension lengths.

In addition, in FIG. 11A, it is shown that the tether structures 126 (as shown in FIG. 9) are originally disposed at the corners 147 of the semiconductor chip 100. The tether structures 126 barely take up space of wafer, because the tether structures 126 are at the corners 147. Therefore, adjacent semiconductor chips 100 are arranged closely when forming the semiconductor chips 100, thereby increasing the number of the semiconductor chips 100 produced per wafer. Further, the area of the tether structures 126 remaining on the transferred semiconductor chips 100 (i.e. the protruding portions 182) may be reduced. This may effectively reduce the effect on light pattern of devices resulting from the remaining tether structures, and enhance the lighting performance of the semiconductor chips 100.

In some embodiments, the semiconductor chips 100 have lengths and widths, and the widths of the protruding portions 182 are not greater than ⅓ of the widths of the semiconductor chips 100. The widths of the protruding portions 182 basically depend on materials of the passivation layer 140. However, if the widths of the protruding portions 182 are too large, it is unfavorable for the separation of the semiconductor chips 100 and the tether structures 126. If the widths of the protruding portions 182 are too small, the passivation layer 140 may not be able to support the semiconductor chip 100 after removing the sacrificial layer 160.

Figure 11B:
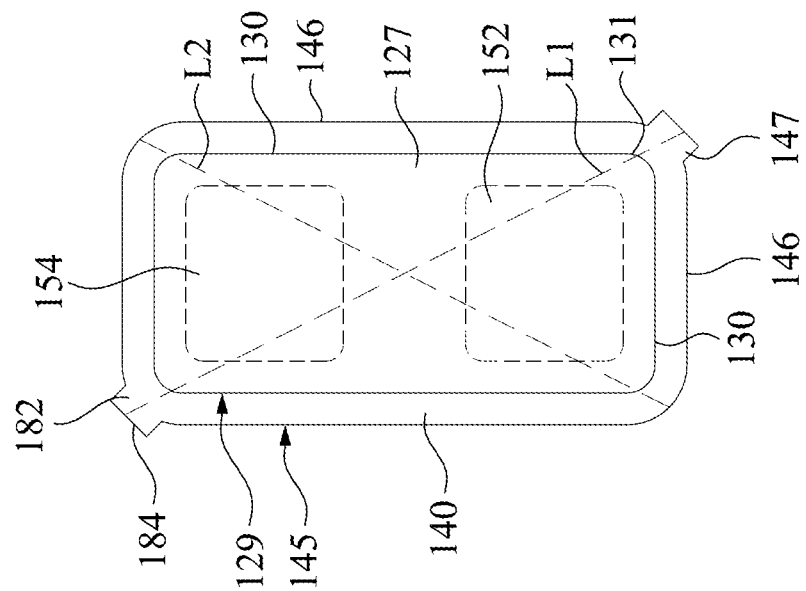
Figure 11C:
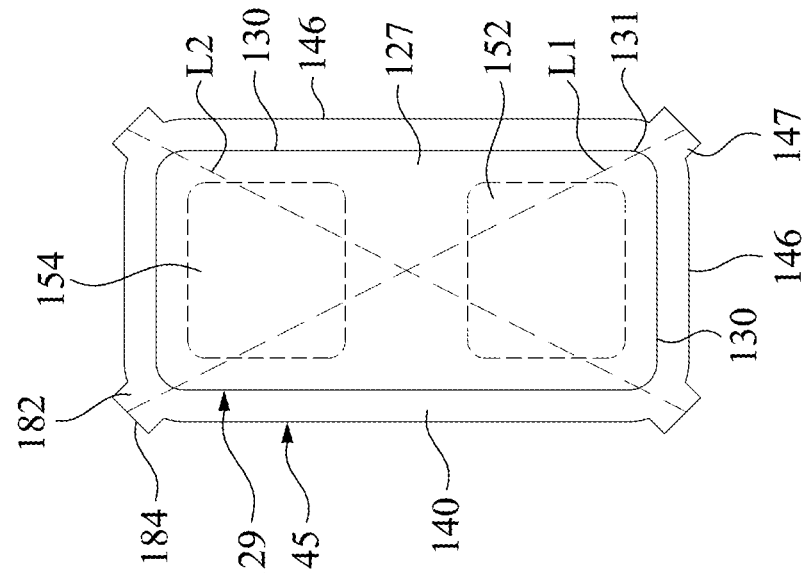
Figure 11D:
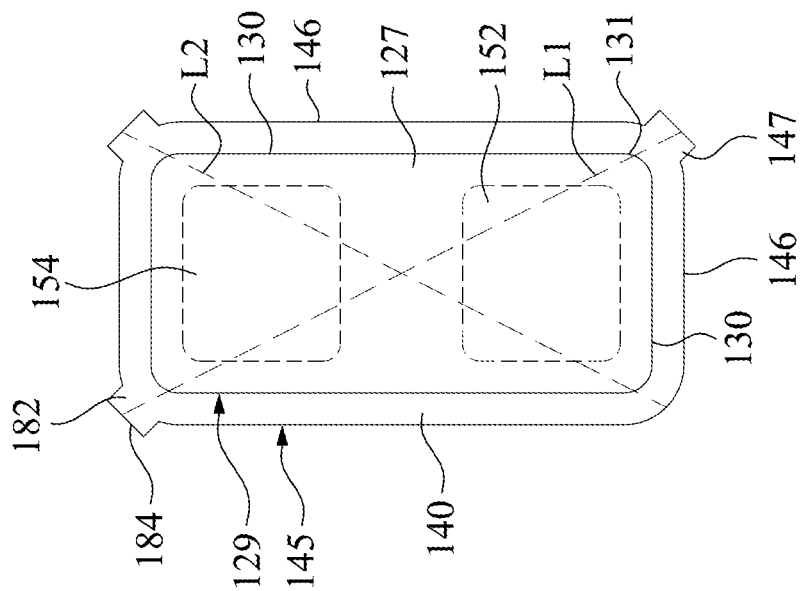

Although FIG. 11A illustrates that the semiconductor chip 100 has two protruding portions 182, the number of the protruding portions 182 is not limited to two. As shown in FIGS. 11B-11D, FIGS. 11B, 11C and 11D respectively illustrate that the semiconductor chip 100 has one, three and four protruding portions 182. In addition, each two of the non-adjacent corners 147 may form a diagonal, such as diagonal connecting lines L1, L2 shown in FIGS. 11A-11D. The ends of the diagonal connecting lines may be the middle point of the boundary of the corner 147 without the protruding portion 182, or the middle point of the boundary of the protruding portion 182. For example, the diagonal connecting line may be a line connecting the middle points of two fracture surfaces 184, such as the connecting line L1 shown in FIG. 11A. The diagonal connecting line may be a line connecting the middle points of two corners 147, such as the connecting line L2 shown in FIG. 11A. The diagonal connecting lines may be a line connecting the middle points of a corner 147 and a fracture surface 184, such as the connecting line L1 shown in FIG. 11B. Due to the existence of the protruding portion 182, the diagonal connecting lines L1, L2 are not in equal lengths in each of the semiconductor chips 100. This situation is present that when removing the semiconductor chip 100 from the tether structure 126 (as shown in FIG. 9), the portions which connect to the tether structures 126 are not under the same forces, thereby causing the protruding portions 182 to be formed with different lengths.

Figure 12:
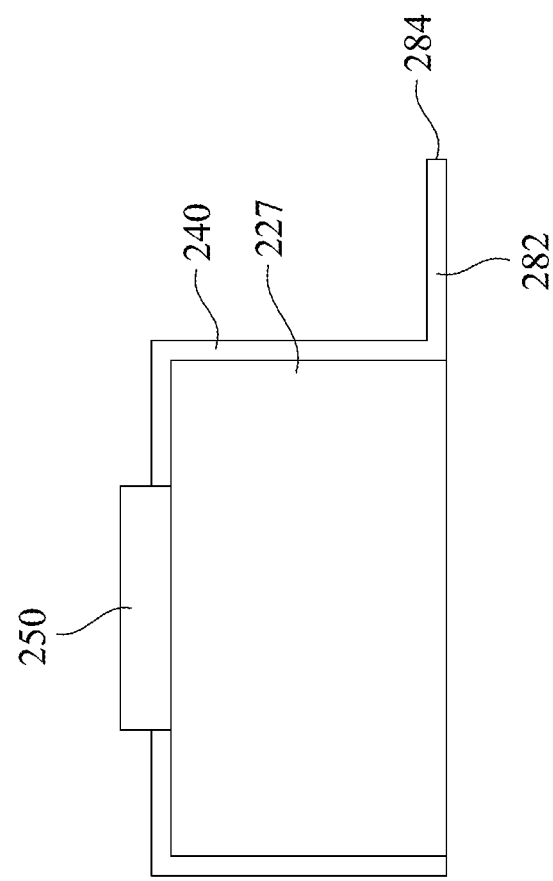
FIG. 12 illustrates a cross-section view of a semiconductor chip in accordance with some embodiments of the present disclosure.

The semiconductor chip in the present disclosure may not be limited to the LED chip discussed above. FIG. 12 illustrates a cross-section view of a semiconductor chip 200 in accordance with some embodiments of the present disclosure. In FIG. 12, the semiconductor chip 200 may be an integrated circuit (IC) chip, and includes a semiconductor stack 227, a passivation layer 240 and a first electrode 250. The passivation layer 240 conformally covers the semiconductor stack 227, and the first electrode 250 penetrates the passivation layer to be connected to the semiconductor stack 227. Further, the passivation layer 240 includes a protruding portion 282 with a fracture surface 284. The difference between the semiconductor chip 200 and the semiconductor chip 100 is the composition of the semiconductor stacks. In some embodiments, the semiconductor stack 227 of the semiconductor chip 200 may include silicon layer, etc. A metal layer, interconnections, devices (such as transistors, resistors, and capacitors, etc.), or other suitable structures may be formed in the semiconductor stack 227, and the first electrode 250 may electrically connect to the devices in the semiconductor stack 227.

FIG. 13A illustrates a cross-section view of a light-emitting device 300 in accordance with some embodiments of the present disclosure. The light-emitting device 300 includes a substrate 310, light-emitting units 320 and a control unit 330. The light-emitting units 320 and the control unit 330 are arranged on the substrate 310. The substrate 310 may be a circuit board to provide electricity for the light-emitting units 320 and the control unit 330.

The light-emitting units 320 include LED chips 322. The LED chips 322 may be the semiconductor chips 100 as discussed before. As the embodiments shown in FIG. 13A, the LED chips 322 may be blue light LED chips. In some embodiments, the light-emitting units 320 are light-emitting units 320B able to emit blue light.

In other embodiments, the light-emitting units 320 are light-emitting units 320R able to emit red light and light-emitting units 320G able to emit green light. The light-emitting units 320R and the light-emitting units 320G may further include conversion layers and filters. In each of the light-emitting units 320R and the light-emitting units 320G, the conversion layers 324 with quantum dots or phosphor materials are disposed on the corresponding LED chips 322 to convert the light emitted from the LED chips 322 into light with different wavelengths, such as red light or green light. The filters 326 for different colors are disposed on the corresponding conversion layer to filter light with specific wavelength. For example, a red light conversion layer 324R may convert blue light emitted from the LED chips 322 into red light to emit red light through a red light filter 326R. A green light conversion layer 324G may convert blue light emitted from the LED chips 322 into green light to emit green light through a green light filter 326G. Apart from the blue LED chips, the LED chips in the light-emitting units 320R and 320G may be other suitable chips, such as ultra violet LED chips. Opaque structures 328 are between each two of the light-emitting units 320 to ensure lights emitted from the light-emitting units 320 emit towards a desired direction and prevent from crosstalk between the adjacent light-emitting units 320. The red light, green light and blue light respectively emitted from the light-emitting units 320R, 320G, and 320B may be mixed to form white light and may be used in subsequent applications.

The control unit 330 includes an IC chip 332 electrically connecting to the light-emitting units 320. The IC chip 332 may be the semiconductor chips 200 as discussed before. The control unit 330 may be used to control the light-emitting units 320, such as the brightness and the switch of the light-emitting units 320.

In some embodiments, an encapsulation material 340 is filled on the LED chips 322 and the IC chip 332. The encapsulation material 340 is a transparent encapsulation material used for preventing the LED chips 322, the IC chip 332 and the substrate 310 from being damaged (such as water vapor or oxygen).

Figure 13C:
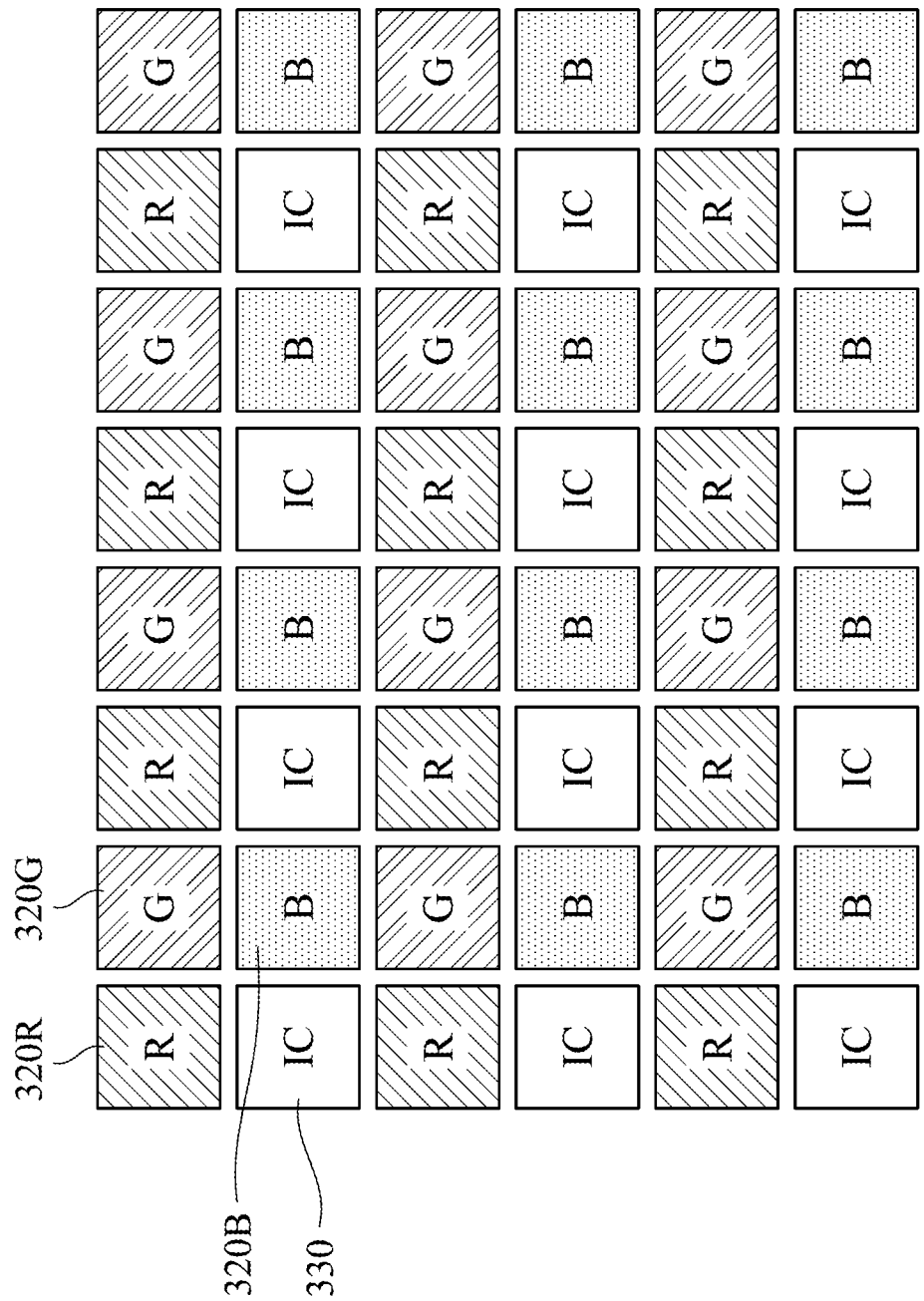
FIG. 13C illustrates a top view of FIGS. 13A-13B.

The light-emitting units 320 and the control units 330 may be arranged in any suitable patterns. In some embodiments, the arrangement of the light-emitting units 320 (such as light-emitting units 320R, 320G and 320B) and the control units 330 is shown as FIG. 13C. However, it is noted that the arrangement of the light-emitting units 320 and the control unit 330 is not limited to the pattern shown in FIG. 13C. For example, the light-emitting units 320R, 320G and 320B and the control unit 330 may be arranged in a same row in order, as shown in FIG. 13A.

In some other embodiments, the light-emitting device 300 is shown as FIG. 13B. The LED chips 322 of the light-emitting units 320R and 320G are respectively a red LED chip and a green LED chip. Therefore, the light-emitting units 320R and 320G may not respectively include conversion layers 324R and 324G but emit the red light and the green light.

Figure 14:
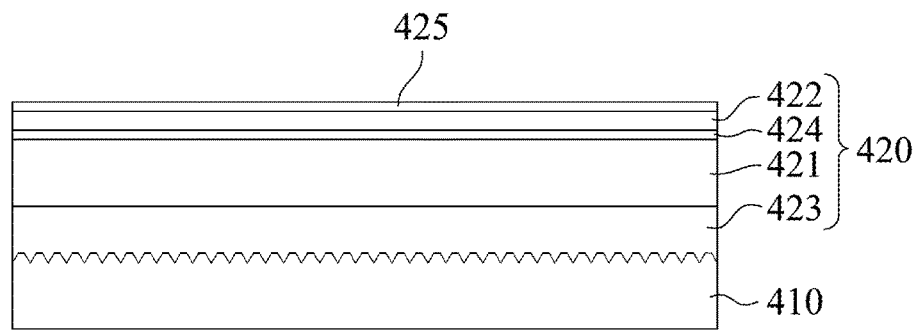
FIGS. 14-21 illustrate cross-section views of a semiconductor chip in the intermediate manufacturing process in accordance with other embodiments of the present disclosure.
Figure 23A:
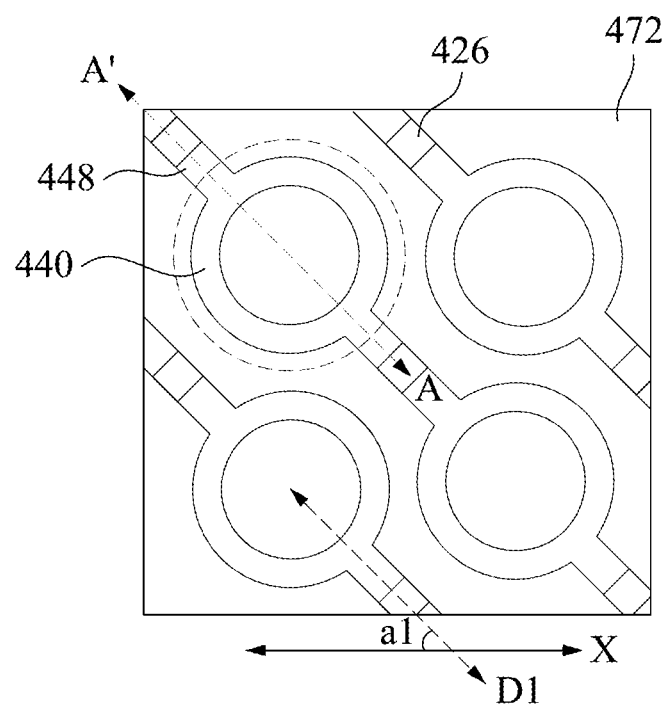
FIG. 23A illustrates a plan view of the semiconductor chip in the intermediate manufacturing process before transfer in accordance with some embodiments of the present disclosure.

FIGS. 14-21 illustrate cross-section views of a semiconductor chip in the intermediate manufacturing process in accordance of other embodiments of the present disclosure, wherein FIGS. 14-21 are cross-section views along line A-A' in FIG. 23A. In FIG. 14, a first substrate 410 is provided, and a semiconductor stack 420 and a transparent conductive layer 425 may be deposited on the first substrate 410. Detailed discussion related to the first substrate 410, the semiconductor stack 420, and the transparent conductive layer 425 are similar to or same as the discussion related to FIG. 1, so the discussion of the embodiments is not repeated herein.

Figure 15:
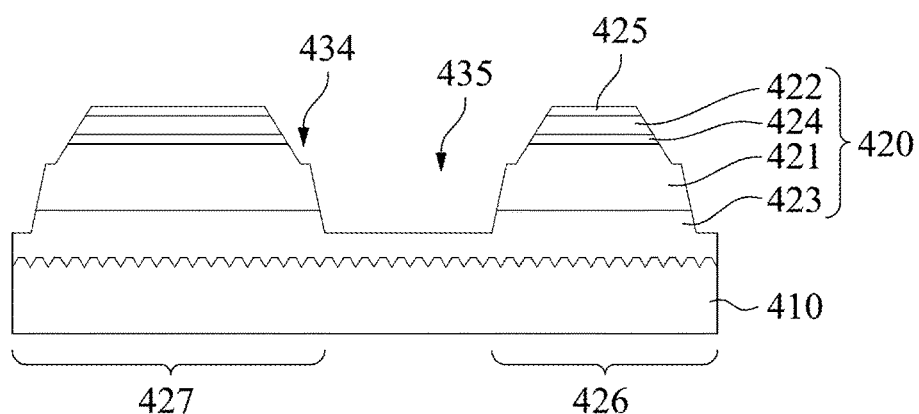

As shown in FIG. 15, trenches 434 and 435 are formed in the semiconductor stack 420 to define the location of the tether structure 426 and the patterned semiconductor stack 427, further defining the shape of the patterned semiconductor stack 427, such as a circle (as shown in FIG. 23A) or a quadrilateral. The distance between the boundaries of the trenches 434 and 435 may be shortened compared to the trenches 134 and 135 in FIG. 2. Detailed discussion related to the manufacturing process in FIG. 15 is similar to or same as the discussion related to FIG. 2, so the discussion of the embodiments is not repeated herein.

Figure 16:
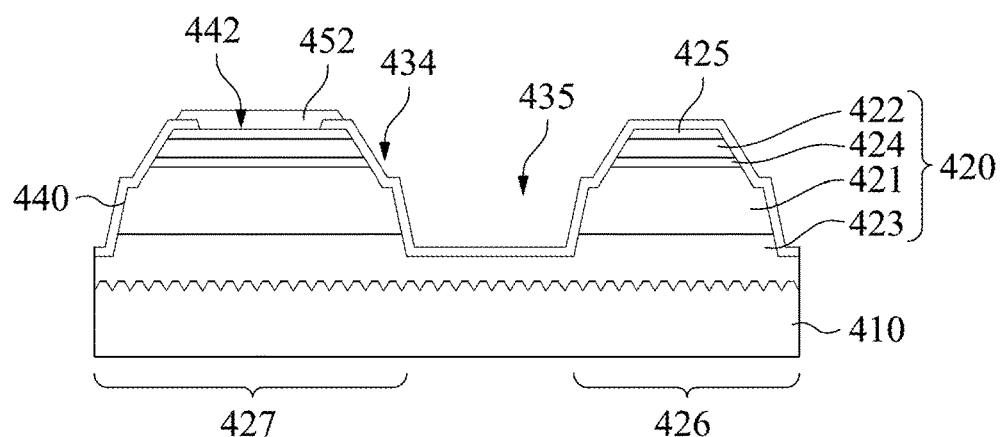

As shown in FIG. 16, a passivation layer 440 is conformally deposited on the semiconductor stack 420 and the transparent conductive layer 425. Detailed discussion related to the passivation layer 440 is similar to or same as the discussion related to FIG. 3, so the discussion of the embodiments is not repeated herein. A first electrode hole 442 is then formed in the passivation layer 440 to expose the semiconductor stack 420 (or the transparent conductive layer 425). After forming the first electrode hole 442, a first electrode 452 is formed in the first electrode hole 442.

Figure 17:
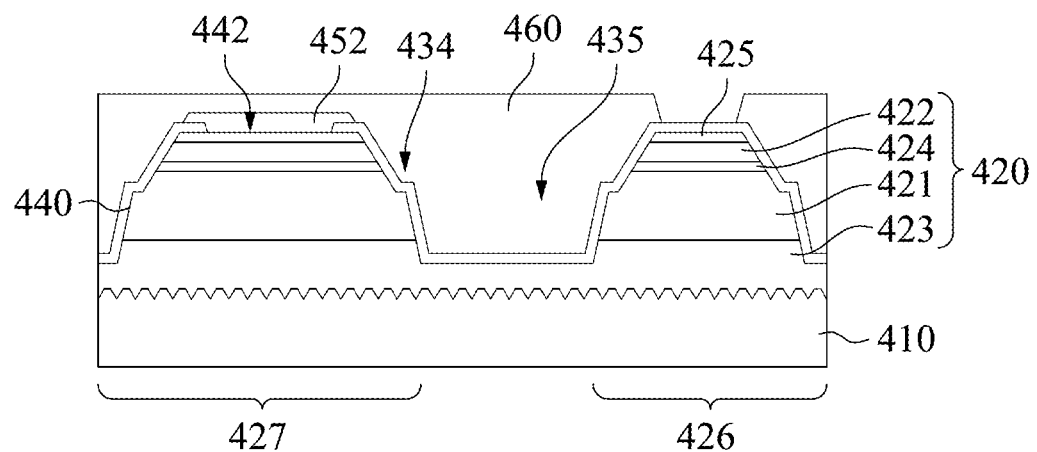
Figure 18:
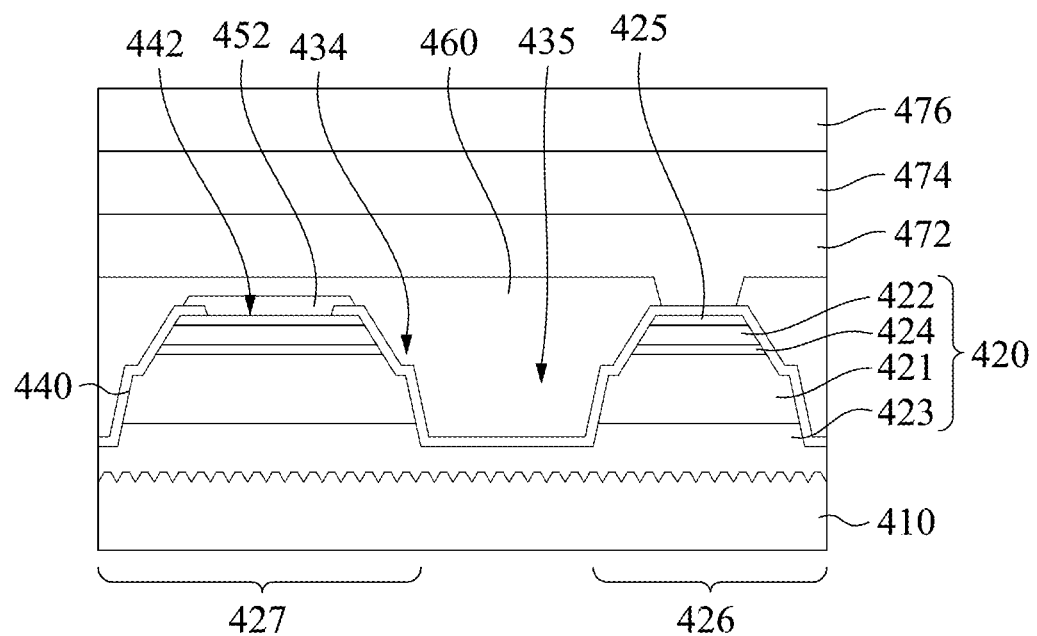
Figure 19:
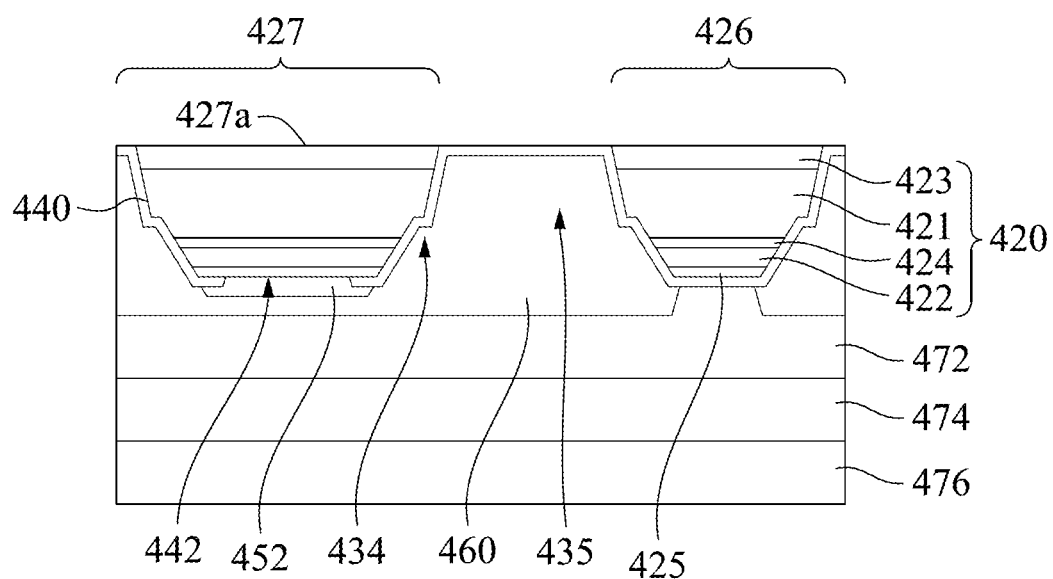

As shown in FIGS. 17-19, a sacrificial layer 460, a supporting structure layer 472, a bonding layer 474 and the second substrate 476 are formed over the passivation layer 440 and the first electrode 452. The structure shown in FIG. 18 is then flipped and the first substrate 410 and a portion of the semiconductor stack 420 are removed to form a bottom surface 427a. Detailed description related to the sacrificial layer 460, the semiconductor layer 472, the bonding layer 474, the second substrate 476 and the manufacturing process are similar to or same as the discussion related to FIGS. 5-8, so the discussion of the embodiments is not repeated herein.

Figure 20:
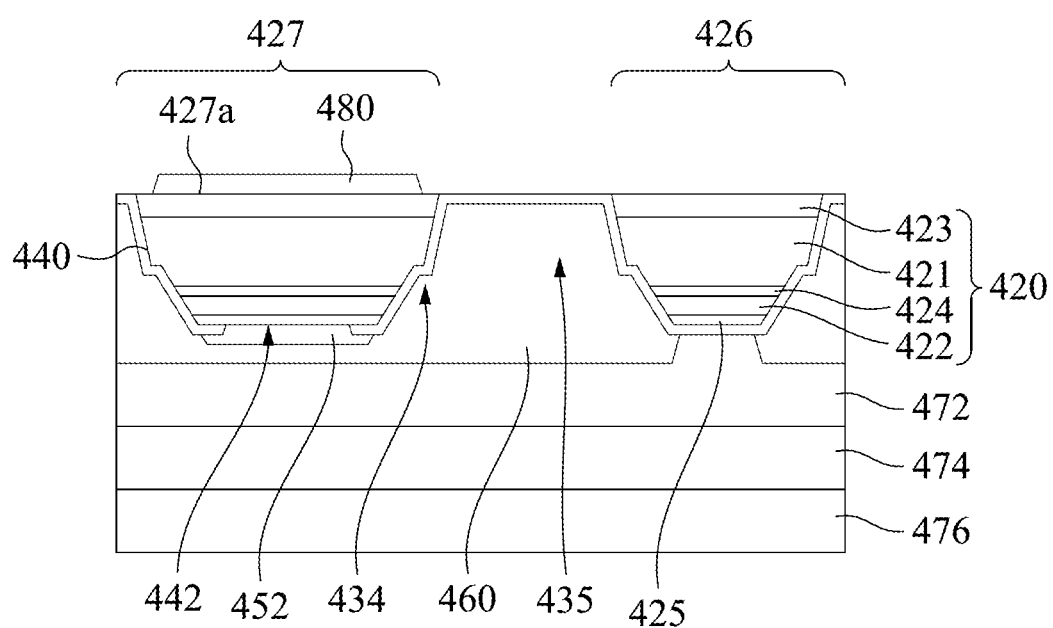

In some embodiments, as shown in FIG. 20, a second electrode 480 is formed on the bottom surface 427a of the semiconductor stack 427. The second electrode 480 and the first electrode 452 are on the opposite sides of the semiconductor stack 420. In some other embodiments, the second electrode 480 may not be formed on the semiconductor stack 420. In this operation, a complete structure of a semiconductor chip 400 is formed.

Figure 21:
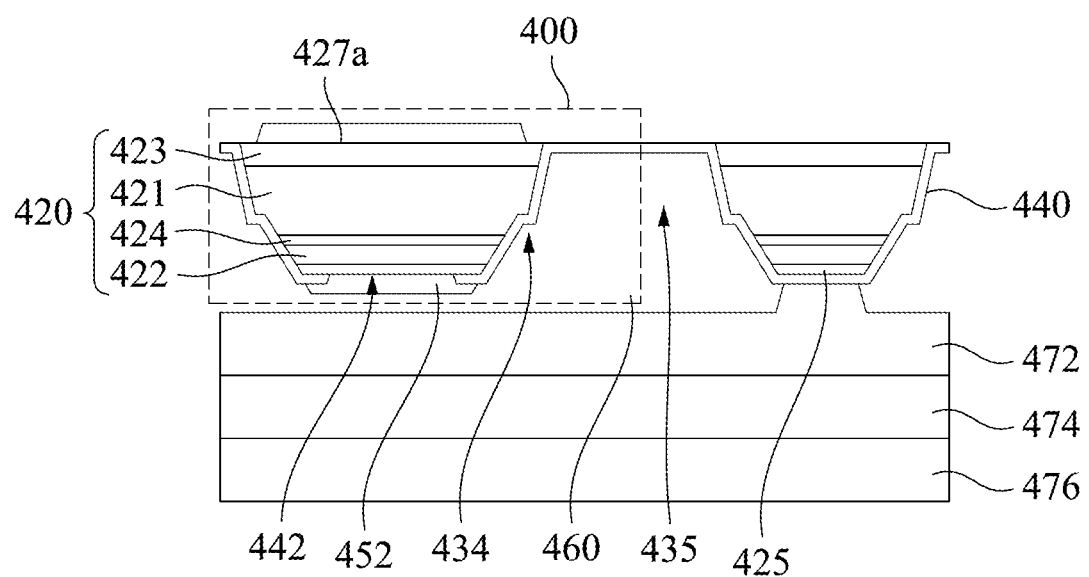

As shown in FIG. 21, the sacrificial layer 460 is removed and the semiconductor chip 400 is transferred to the devices in subsequent applications. The manufacturing process in FIG. 21 is similar to or the same as the discussion related to FIGS. 5-9, so the discussion of the embodiments is not repeated herein.

Figure 22:
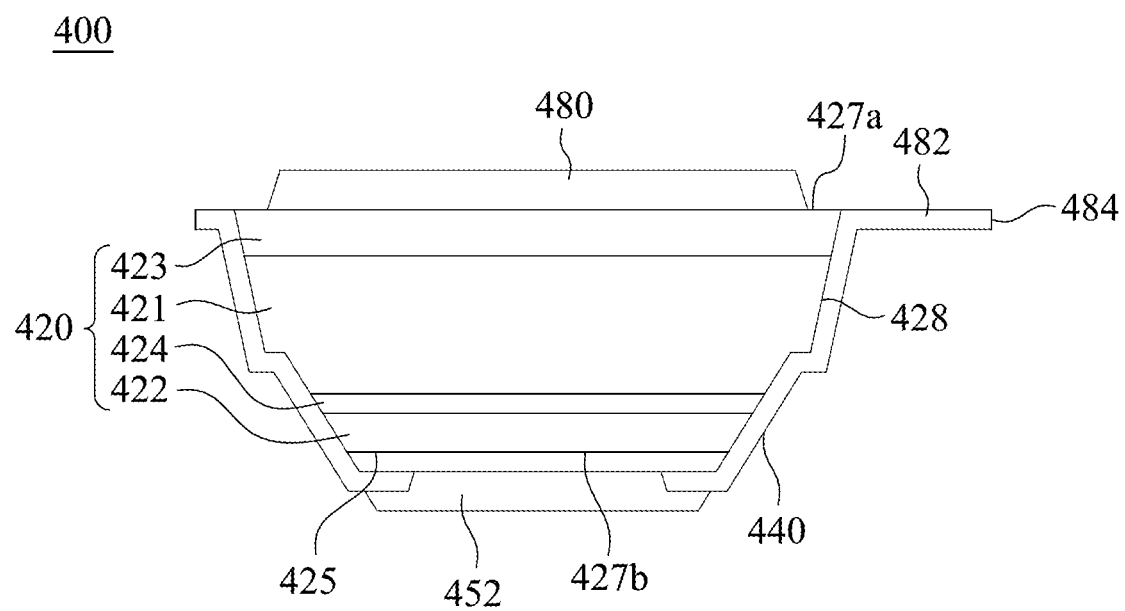
FIG. 22 illustrates a cross-section view of the semiconductor chip in accordance with some embodiments of the present disclosure.

The transferred semiconductor chip 400 is shown as FIG. 22. The semiconductor stack 427 of the semiconductor chip 400 has a bottom surface 427a and a top surface 427b, and sidewalls 428 are between the bottom surface 427a and the top surface 427b. Also, the passivation layer 440 of the semiconductor chip 400 includes a protruding portion 482 with a fracture surface 484. The difference between the semiconductor chip 400 and the semiconductor chip 100 in FIG. 10A (or in FIG. 10B) is that the second electrode 480 and the first electrode 452 are on the opposite sides of the semiconductor stack 427, while the first electrode 152 and the second electrode 154 are at the same side of the semiconductor stack 127. Other detailed description related to the semiconductor chip 400 is similar to or same as the discussion related to FIG. 10A, so the discussion of the embodiments is not repeated herein.

FIG. 23A illustrates a plan view of the semiconductor chip 400 in the intermediate manufacturing process before transfer in accordance with some embodiments of the present disclosure. In FIG. 23A, the tether structures 426 on the supporting structure layer 472 provide support for the semiconductor chips 400. The passivation layers 440 of the semiconductor chips 400 have circular plan-view contours and are attached to the tether structures 426 by the connecting portions 448. The semiconductor chips 400 are arranged on the supporting structure layer 472 in a first direction X, and a first extension direction D1 of the connecting portions 448 and the first direction X together define a first angle a1. In some embodiments, the first angle a1 may be in a range from about 10° to about 80°, such as about 45°.

Figures 23B, 23C:
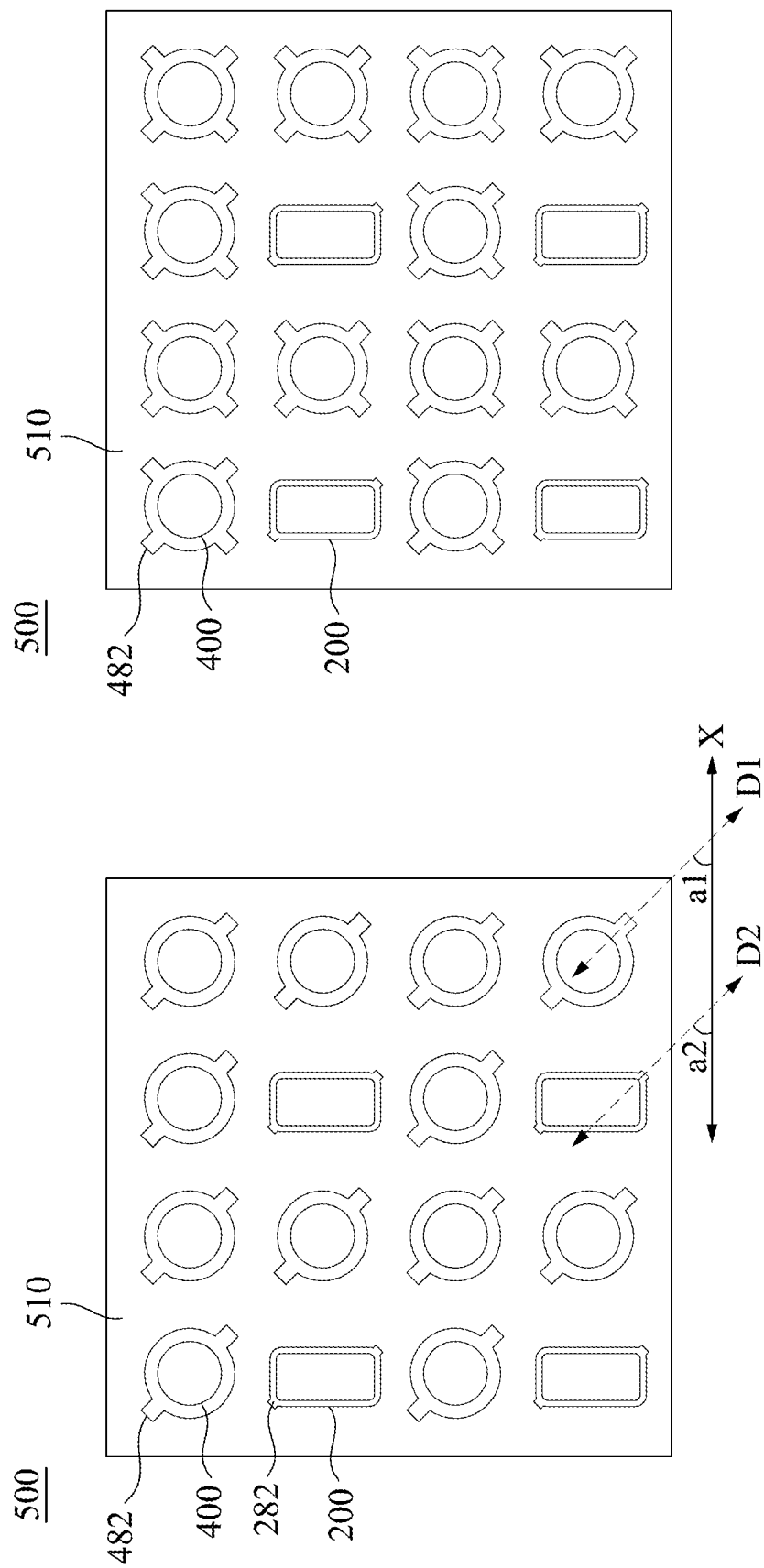
FIGS. 23B-23C illustrate top views of a light-emitting device using semiconductor chips in accordance with some embodiments of the present disclosure.

FIG. 23B illustrates a top view of a light-emitting device 500 in accordance with some embodiments of the present disclosure. The semiconductor chips 400 are transferred to the substrate 510, as shown in FIG. 23B. During the transfer, the transfer apparatus does not change the direction (such as rotate) of the semiconductor chips 400, so the semiconductor chips 400 are still arranged in the first direction X after transferring to the substrate 510. The protruding portions 482 formed after the transfer still extend in the first extension direction D1, and the angle between the first extension direction D1 and the first direction X is also the first angle a1. After or before transferring the semiconductor chips 400, the semiconductor chips 200 shown in FIG. 12 may be transferred, and the semiconductor chips 200 are arranged in the first direction X, electrically connecting to the semiconductor chips 400. The extension direction of the protruding portions 282 of the semiconductor chips 200 is the second extension direction D2, and the second extension direction D2 and the first direction X together define a second angle a2. In some embodiments, the second angle a2 may be in a range from about 10° to about 80°, such as about 45°. After transferring the semiconductor chips 400 and the semiconductor chips 200, other structures similar to FIGS. 13A-13B, such as transfer layers, filters, transparent encapsulation materials and opaque structures, may be subsequently formed to produce display devices.

Although FIG. 23B illustrates that the semiconductor chip 400 after the transfer has two protruding portions 482, the number of the protruding portions 482 is not limited. In some embodiments, the number of the connecting portions of the semiconductor chip 400 may be adjusted, thereby adjusting the number of the protruding portions 482 of the semiconductor chip 400, as shown in FIG. 23C. Further, in some embodiments, a portion of the semiconductor chips 400 and 200 are not in the same pattern as shown in FIG. 23B; for example, the protruding portions of a portion of the semiconductor chips 400 and 200 may be parallel to the first direction X.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor chip, comprising:
   a semiconductor stack comprising a top surface, a bottom surface opposite to the top surface, and a plurality of sidewalls between the top surface and the bottom surface; and
   a passivation layer covering the sidewalls of the semiconductor stack;
   wherein when viewing from the bottom surface, a plan-view contour of the semiconductor stack comprises a plurality of edges and first corners, each of the first corners is defined by two adjacent of the edges; and
   wherein a plan-view contour of the passivation layer surrounding the plan-view contour of the semiconductor stack comprises a plurality of second corners respectively corresponding to one of the first corners; and
   wherein the plan-view contour of the passivation layer comprises a protruding portion disposed corresponding to one of the second corners.

2. The semiconductor chip of claim 1, wherein the protruding portion of the passivation layer has a fracture surface.

3. The semiconductor chip of claim 1, wherein the bottom surface has a concave-and-convex structure.

4. The semiconductor chip of claim 1, wherein the semiconductor chip is a light-emitting diode chip and the semiconductor chip further comprises a first electrode on the passivation layer, wherein the semiconductor stack comprises a first semiconductor layer, an active layer and a second semiconductor layer stacked in order and the first electrode penetrates the passivation layer to electrically connect to the first semiconductor layer.

5. The semiconductor chip of claim 4, further comprising a second electrode on the passivation layer, and the second electrode penetrating the passivation layer to electrically connect to the second semiconductor layer, wherein the first electrode and the second electrode are on a same side of the semiconductor stack.

6. The semiconductor chip of claim 1, wherein the semiconductor chip is an integrated circuit chip and the semiconductor chip further comprises a first electrode on the semiconductor stack to electrically connect to the semiconductor stack.

7. A light-emitting device, comprising:
a substrate;
a plurality of light-emitting units on the substrate, the light-emitting units emitting red light, green light or blue light respectively and an opaque structure being between two adjacent of the light-emitting units, wherein at least one of the light-emitting units comprises a semiconductor chip of claim 1; and
a control unit on the substrate, wherein the control unit is electrically connected to the at least one of the light-emitting units.

8. The semiconductor chip of claim 1, wherein when viewing from the bottom surface, a width of the protruding portion is not greater than ⅓ of a width of the semiconductor chip.

9. The semiconductor chip of claim 1, wherein the plan-view contour of the passivation layer surrounding the plan-view contour of the semiconductor stack further comprises another protruding portion adjacent to another one of the second corners and the another protruding portion protrudes outwards from the plan-view contour of the passivation layer; and
wherein a length of the protruding portion protrudes outwards from the plan-view contour of the passivation layer is different from a length of the another protruding portion protrudes outwards from the plan-view contour of the passivation layer.

10. A semiconductor chip, comprising:
a semiconductor stack comprising a top surface, a bottom surface opposite to the top surface, and a plurality of sidewalls between the top surface and the bottom surface; and
a passivation layer covering the sidewalls of the semiconductor stack;
wherein when viewing from the bottom surface, a plan-view contour of the semiconductor chip is a closed shape with a plurality of edges and corners, each of the corners is defined by two adjacent edges and the passivation layer has an outer fracture surface adjacent to one of the corners; and
wherein when viewing from the bottom surface, the outer fracture surface is not parallel to the two adjacent edges defining the one of the corners.

11. The semiconductor chip of claim 10, wherein a connecting line of any two non-adjacent ones of the corners of the plan-view contour of the semiconductor chip is not in equal length.

12. The semiconductor chip of claim 10, wherein the semiconductor chip is a light-emitting diode chip and the semiconductor chip further comprises a first electrode on the passivation layer, wherein the semiconductor stack comprises a first semiconductor layer, an active layer and a second semiconductor layer stacked in order and the first electrode penetrates the passivation layer to electrically connect to the first semiconductor layer.

13. The semiconductor chip of claim 12, further comprising a second electrode on the passivation layer, and the second electrode penetrating the passivation layer to electrically connect to the second semiconductor layer, wherein the first electrode and the second electrode are on a same side of the semiconductor stack.

14. The semiconductor chip of claim 10, wherein the semiconductor chip is an integrated circuit chip and the semiconductor chip further comprises a first electrode on the semiconductor stack to electrically connect to the semiconductor stack.

15. The semiconductor chip of claim 10, wherein the plan-view contour of the semiconductor chip is a closed quadrilateral comprising four edges and four corners.

16. A light-emitting device, comprising:
a substrate;
a plurality of light-emitting units on the substrate, the light-emitting units emitting red light, green light or blue light respectively and an opaque structure being between two adjacent of the light-emitting units, wherein at least one of the light-emitting units comprises a semiconductor chip of claim 10; and
a control unit on the substrate, wherein the control unit electrically connects to the at least one of the light-emitting units.

* * * * *